US012677551B2

(12) United States Patent
Tabatake

(10) Patent No.: US 12,677,551 B2
(45) Date of Patent: Jul. 7, 2026

(54) DISPLAY DEVICE

(71) Applicant: Magnolia White Corporation, Tokyo (JP)

(72) Inventor: Hiroshi Tabatake, Tokyo (JP)

(73) Assignee: MAGNOLIA WHITE CORPORATION, Tokyo (JP)

( * ) Notice: Subject to any disclaimer, the term of this patent is extended or adjusted under 35 U.S.C. 154(b) by 665 days.

(21) Appl. No.: 18/156,412

(22) Filed: Jan. 19, 2023

(65) Prior Publication Data

US 2023/0232684 A1    Jul. 20, 2023

(30) Foreign Application Priority Data

Jan. 20, 2022    (JP) ................................. 2022-007333

(51) Int. Cl.
*H10K 59/131*        (2023.01)
*H10K 59/80*        (2023.01)

(52) U.S. Cl.
CPC ......... *H10K 59/131* (2023.02); *H10K 59/871* (2023.02)

(58) Field of Classification Search
CPC ... H10K 59/131; H10K 59/871; H10K 59/873
See application file for complete search history.

(56) References Cited

U.S. PATENT DOCUMENTS

| 2004/0160170 A1 | 8/2004 | Sato et al. |
| 2009/0009069 A1 | 1/2009 | Takata |

| 2013/0001620 A1* | 1/2013 | Sugisawa ............. H10K 59/122 |
| | | 257/E33.062 |
| 2019/0334112 A1* | 10/2019 | Lee ...................... H10K 71/221 |
| 2019/0363275 A1 | 11/2019 | Ochi et al. |
| 2020/0176550 A1 | 6/2020 | Youn et al. |
| 2022/0157899 A1* | 5/2022 | Yanagisawa ........... H10K 59/88 |

FOREIGN PATENT DOCUMENTS

| CN | 110416261 A | 11/2019 |
| CN | 114512517 A | 5/2022 |
| DE | 10 2021 211887 A1 | 5/2022 |
| EP | 1 331 666 B1 | 11/2014 |
| EP | 3 754 719 A1 | 12/2020 |

(Continued)

OTHER PUBLICATIONS

Jeon et al., KR 102016083588, Jul. 12, 2016 (Year: 2016).*

(Continued)

*Primary Examiner* — Mary Ellen Bowman
(74) *Attorney, Agent, or Firm* — XSENSUS LLP

(57) ABSTRACT

According to one embodiment, a display device includes a substrate, an insulating layer above the substrate, a lower electrode in a display area, a rib including an aperture overlapping the lower electrode, a conductive partition above the rib in the display area, an upper electrode facing the lower electrode and connected to the partition, an organic layer at least partially located between the lower and upper electrodes and emitting light based on a potential difference between the electrodes, a feed line in a surrounding area around the display area, and a conductive layer provided above the rib in the surrounding area and connected to the feed line and the partition.

20 Claims, 6 Drawing Sheets

(56) References Cited

FOREIGN PATENT DOCUMENTS

| | | | |
|----|----------------|----|---------|
| JP | 2000-195677 | A | 7/2000 |
| JP | 2004-207217 | A | 7/2004 |
| JP | 2008-135325 | A | 6/2008 |
| JP | 2009-32673 | A | 2/2009 |
| JP | 2010-118191 | A | 5/2010 |
| JP | 2020-113421 | A | 7/2020 |
| WO | 2011/061789 | A1 | 5/2011 |
| WO | 2018/179308 | A1 | 10/2018 |

OTHER PUBLICATIONS

An et al., EP 3754719, Dec. 23, 2020 (Year: 2020).*
Communication Relating to Third Party Observations (no English translation readily available) mailed on Jan. 9, 2025, in corresponding German Patent Application No. 10 2023 200 415.1, 7pp.
English translation of a German Office Action mailed on Feb. 13, 2025, in corresponding German Patent Application No. 10 2023 200 415.1, 5pp.
Machine translation of KR 10-2016-0083588 A.
Japanese Office Action issued Jan. 6, 2026, in corresponding JP Application No. 2022-007333, 10pp.
Chinese Office Action issued Mar. 26, 2026, in CN Application No. 202310062927.7, 24pp.

* cited by examiner

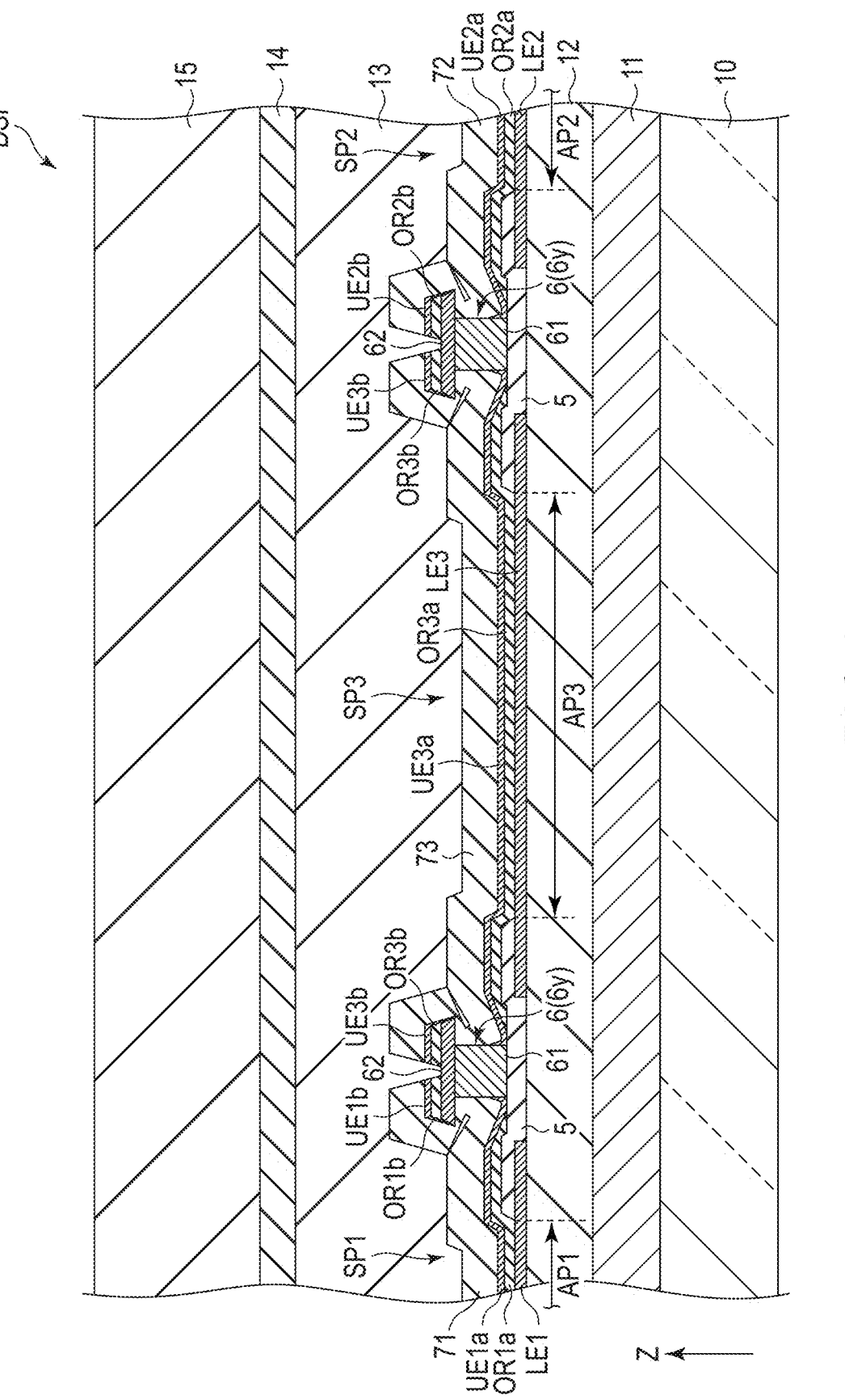
F I G. 3

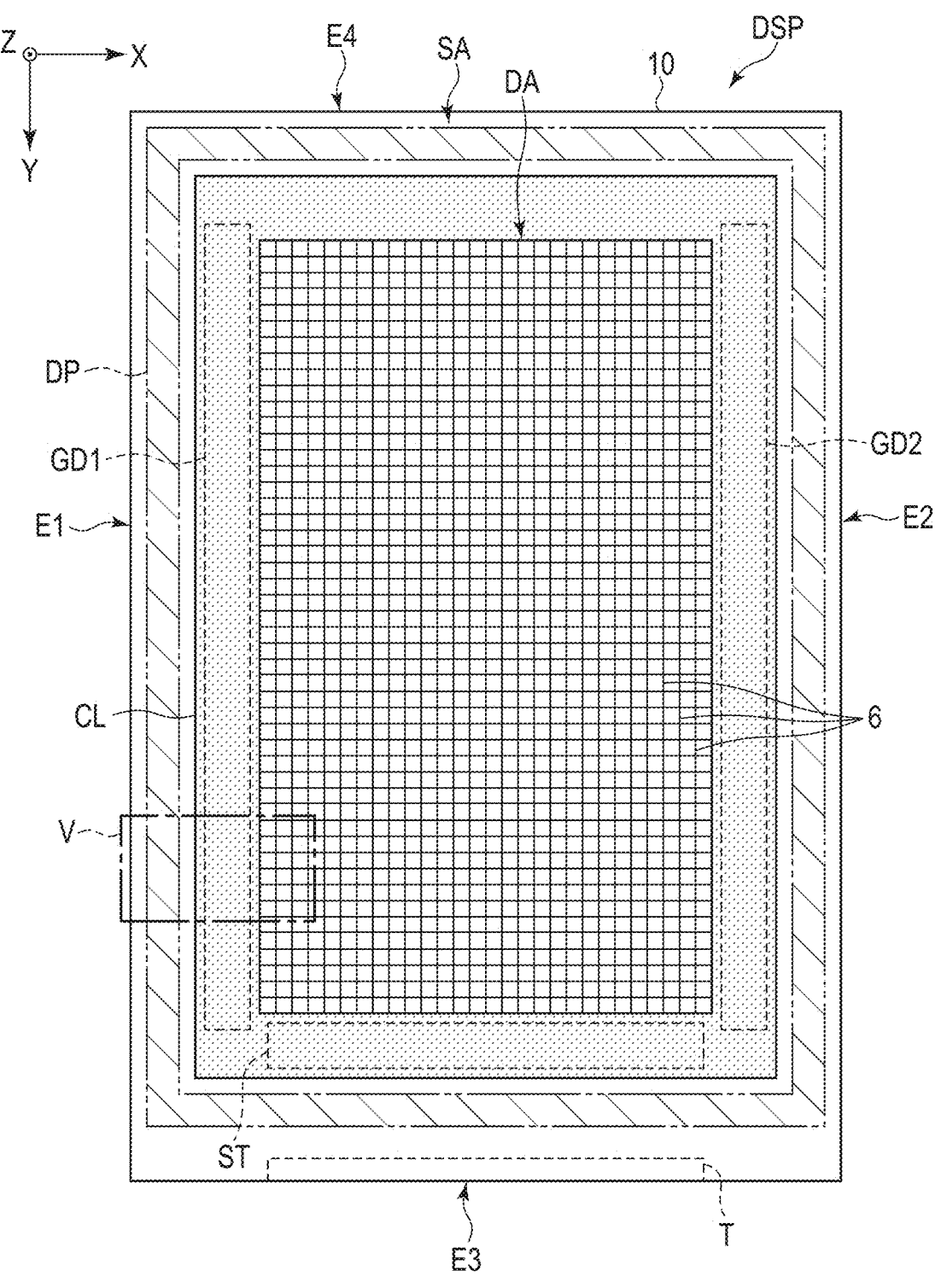
F I G. 4

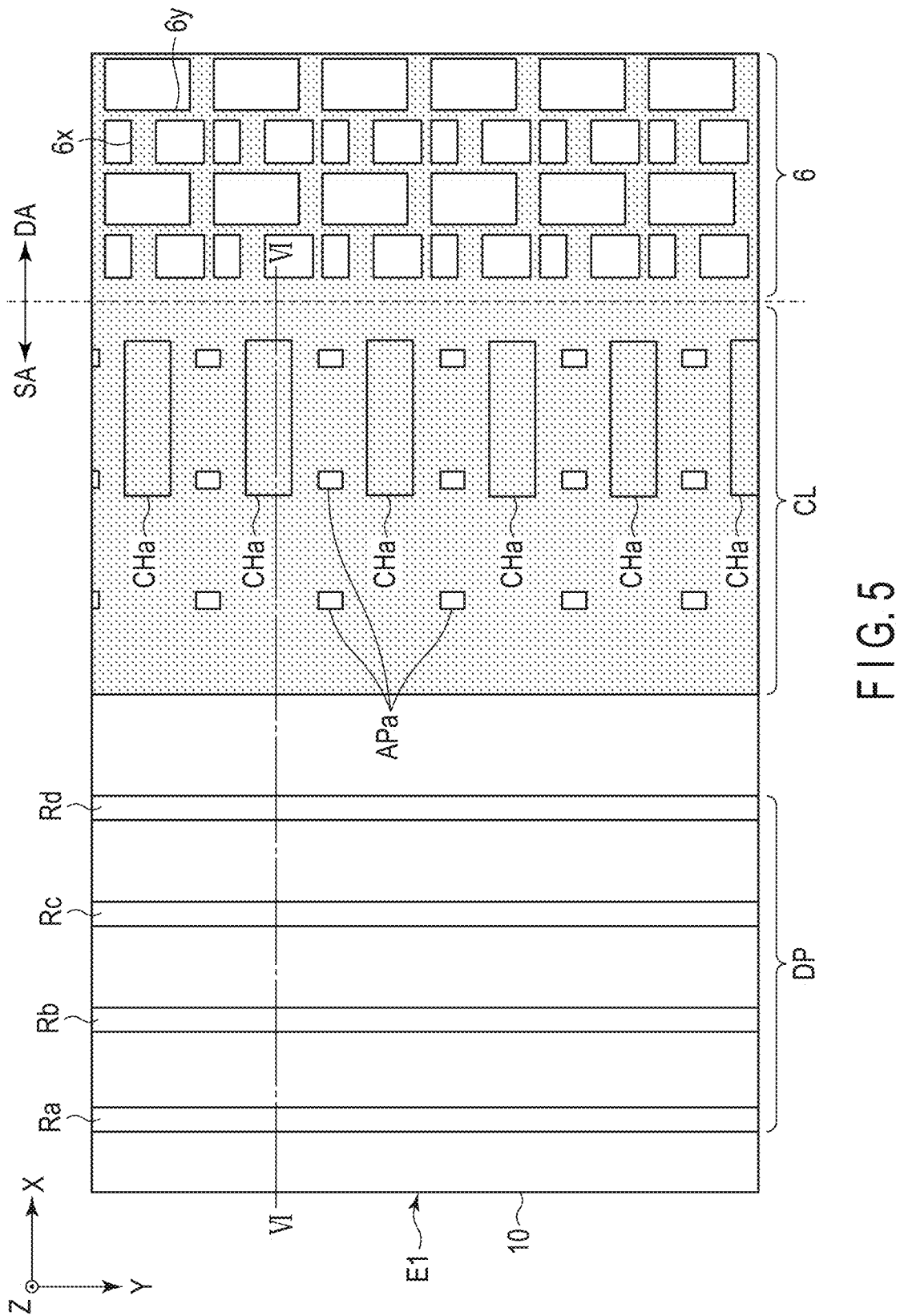
F I G. 5

DISPLAY DEVICE

CROSS-REFERENCE TO RELATED APPLICATIONS

This application is based upon and claims the benefit of priority from Japanese Patent Application No. 2022-007333, filed Jan. 20, 2022, the entire contents of which are incorporated herein by reference.

FIELD

Embodiments described herein relate generally to a display device.

BACKGROUND

Recently, display devices to which an organic light emitting diode (OLED) is applied as a display element have been put into practical use. This display element comprises a lower electrode, an organic layer which covers the lower electrode, and an upper electrode which covers the organic layer.

Voltage is applied to the lower electrode by a pixel circuit provided for each pixel. To the upper electrode, voltage common to subpixels is applied. A structure for applying voltage to the upper electrode has room for improvement in various ways.

BRIEF DESCRIPTION OF THE DRAWINGS

FIG. 3 is a schematic cross-sectional view of the display device along the III-III line of FIG. 2.

FIG. 4 is a schematic plan view of the display device.

FIG. 5 is an enlarged view of the area surrounded by the chained frame in FIG. 4.

DETAILED DESCRIPTION

Figure 1:
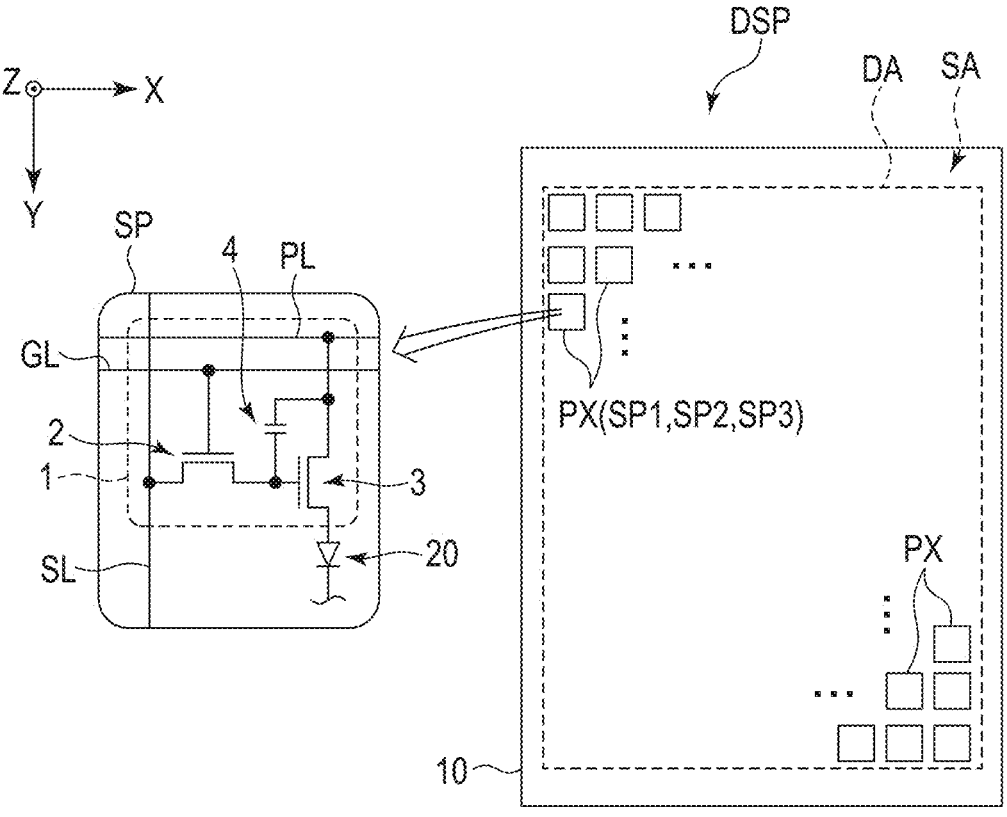
FIG. 1 is a diagram showing a configuration example of a display device according to an embodiment.

In general, according to one embodiment, a display device comprises a substrate, an insulating layer provided above the substrate, a lower electrode provided above the insulating layer in a display area including a pixel, a rib comprising an aperture overlapping the lower electrode, a conductive partition provided above the rib in the display area, an upper electrode facing the lower electrode and connected to the partition, an organic layer at least partially located between the lower electrode and the upper electrode and emitting light based on a potential difference between the lower electrode and the upper electrode, a feed line provided in a surrounding area around the display area, and a conductive layer provided above the rib in the surrounding area and connected to the feed line and the partition.

This configuration can provide a display device comprising an improved structure for applying voltage to an upper electrode.

Embodiments will be described with reference to the accompanying drawings.

The disclosure is merely an example, and proper changes in keeping with the spirit of the invention, which are easily conceivable by a person of ordinary skill in the art, come within the scope of the invention as a matter of course. In addition, in some cases, in order to make the description clearer, the widths, thicknesses, shapes, etc., of the respective parts are illustrated schematically in the drawings, rather than as an accurate representation of what is implemented. However, such schematic illustration is merely exemplary, and in no way restricts the interpretation of the invention. In addition, in the specification and drawings, structural elements which function in the same or a similar manner to those described in connection with preceding drawings are denoted by like reference numbers, detailed description thereof being omitted unless necessary.

In the drawings, in order to facilitate understanding, an X-axis, a Y-axis and a Z-axis orthogonal to each other are shown depending on the need. A direction parallel to the X-axis is referred to as a first direction. A direction parallel to the Y-axis is referred to as a second direction. A direction parallel to the Z-axis is referred to as a third direction. A plan view is defined as appearance when various types of elements are viewed parallel to the third direction Z.

The display device of each embodiment is an organic electroluminescent display device comprising an organic light emitting diode (OLED) as a display element, and could be mounted on a television, a personal computer, a vehicle-mounted device, a tablet, a smartphone, a mobile phone, etc.

FIG. 1 is a diagram showing a configuration example of a display device DSP according to an embodiment. The display device DSP comprises a display area DA which displays an image and a surrounding area SA around the display area DA on an insulating substrate 10. The substrate 10 may be glass or a resinous film having flexibility.

In the present embodiment, the substrate 10 is rectangular as seen in plan view. It should be noted that the shape of the substrate 10 in a plan view is not limited to a rectangular shape and may be another shape such as a square shape, a circular shape or an elliptic shape.

The display area DA comprises a plurality of pixels PX arrayed in matrix in a first direction X and a second direction Y. Each pixel PX includes a plurality of subpixels SP. For example, each pixel PX includes a red subpixel SP1 (first subpixel), a green subpixel SP2 (second subpixel) and a blue subpixel SP3 (third subpixel). Each pixel PX may include a subpixel SP which exhibits another color such as white in addition to subpixels SP1, SP2 and SP3 or instead of one of subpixels SP1, SP2 and SP3.

Each subpixel SP comprises a pixel circuit 1 and a display element 20 driven by the pixel circuit 1. The pixel circuit 1 comprises a pixel switch 2, a drive transistor 3 and a capacitor 4. The pixel switch 2 and the drive transistor 3 are, for example, switching elements consisting of thin-film transistors.

The gate electrode of the pixel switch 2 is connected to a scanning line GL. One of the source electrode and drain electrode of the pixel switch 2 is connected to a signal line SL. The other one is connected to the gate electrode of the drive transistor 3 and the capacitor 4. In the drive transistor 3, one of the source electrode and the drain electrode is connected to a power line PL and the capacitor 4, and the other one is connected to the display element 20.

It should be noted that the configuration of the pixel circuit 1 is not limited to the example shown in the figure. For example, the pixel circuit 1 may comprise more thin-film transistors and capacitors.

The display element 20 is an organic light emitting diode (OLED) as a light emitting element. For example, subpixel SP1 comprises a display element 20 which emits light in a red wavelength range. Subpixel SP2 comprises a display element 20 which emits light in a green wavelength range. Subpixel SP3 comprises a display element 20 which emits light in a blue wavelength range.

Figure 2:
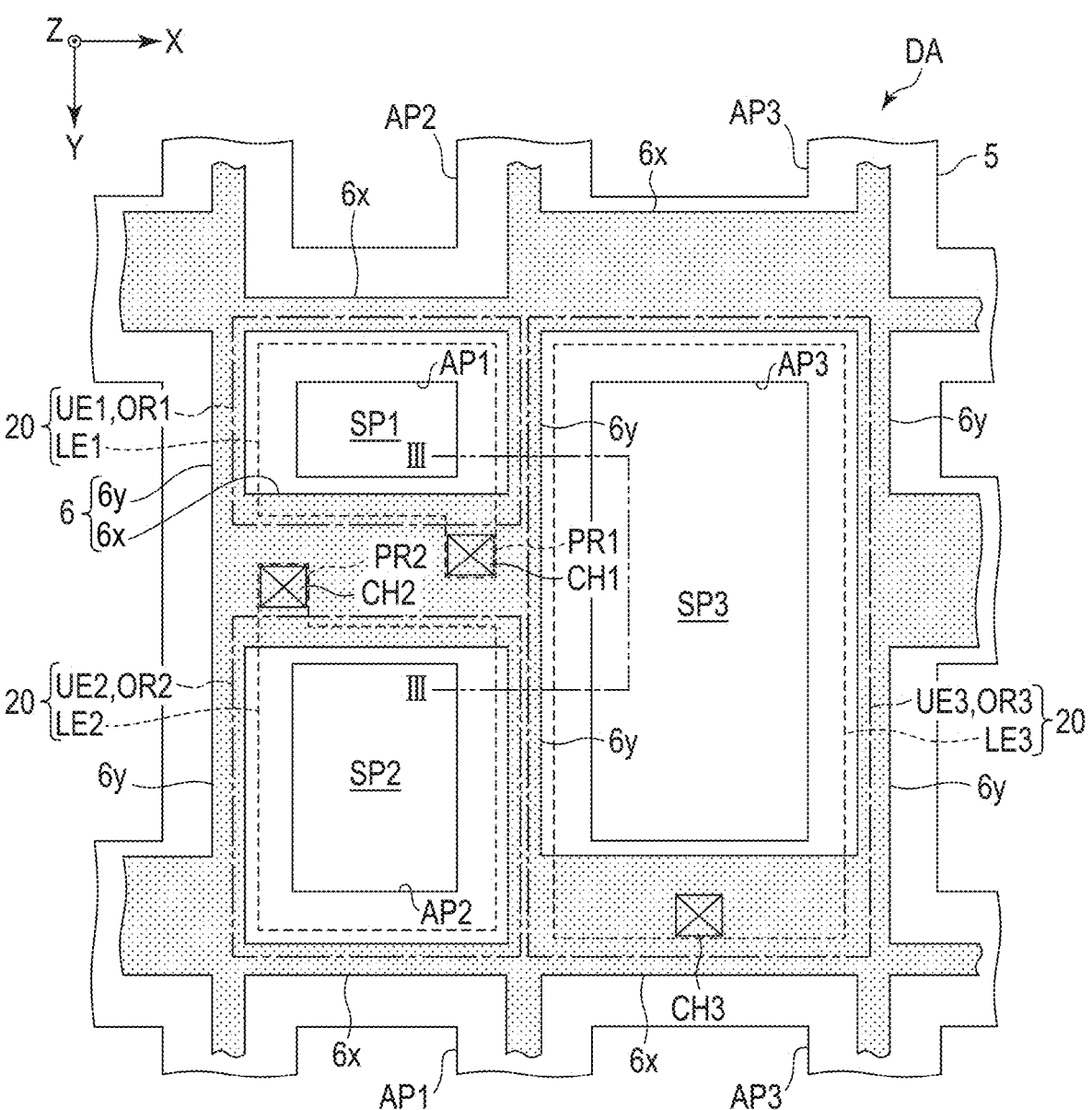
FIG. 2 is a diagram showing an example of the layout of subpixels.

FIG. 2 is a diagram showing an example of the layout of subpixels SP1, SP2 and SP3. In the example of FIG. 2, subpixels SP1 and SP2 are arranged in the second direction Y. Further, each of subpixels SP1 and SP2 is adjacent to subpixel SP3 in the first direction X.

When subpixels SP1, SP2 and SP3 are provided in line with this layout, in the display area DA, a column in which subpixels SP1 and SP2 are alternately provided in the second direction Y and a column in which a plurality of subpixels SP3 are repeatedly provided in the second direction Y are formed. These columns are alternately arranged in the first direction X.

It should be noted that the layout of subpixels SP1, SP2 and SP3 is not limited to the example of FIG. 2. As another example, subpixels SP1, SP2 and SP3 in each pixel PX may be arranged in order in the first direction X.

A rib 5 and a partition 6 are provided in the display area DA. The rib 5 comprises apertures AP1, AP2 and AP3 in subpixels SP1, SP2 and SP3, respectively. In the example of FIG. 2, the aperture AP2 is larger than the aperture AP1, and the aperture AP3 is larger than the aperture AP2.

The partition 6 overlaps the rib 5 as seen in plan view. The partition 6 comprises a plurality of first partitions 6x extending in the first direction X and a plurality of second partitions 6y extending in the second direction Y. The first partitions 6x are provided between the apertures AP1 and AP2 which are adjacent to each other in the second direction Y and between two apertures AP3 which are adjacent to each other in the second direction Y. Each second partition 6y is provided between the apertures AP1 and AP3 which are adjacent to each other in the first direction X and between the apertures AP2 and AP3 which are adjacent to each other in the first direction X.

In the example of FIG. 2, the first partitions 6x and the second partitions 6y are connected to each other. In this configuration, the partition 6 has a grating shape surrounding the apertures AP1, AP2 and AP3 as a whole. In other words, the partition 6 comprises apertures in subpixels SP1, SP2 and SP3 in a manner similar to that of the rib 5.

Subpixel SP1 comprises a lower electrode LE1, an upper electrode UE1 and an organic layer OR1 overlapping the aperture AP1. Subpixel SP2 comprises a lower electrode LE2, an upper electrode UE2 and an organic layer OR2 overlapping the aperture AP2. Subpixel SP3 comprises a lower electrode LE3, an upper electrode UE3 and an organic layer OR3 overlapping the aperture AP3. In the example of FIG. 2, the outer shapes of the upper electrode UE1 and the organic layer OR1 are coincident with each other. The outer shapes of the upper electrode UE2 and the organic layer OR2 are coincident with each other. The outer shapes of the upper electrode UE3 and the organic layer OR3 are coincident with each other.

The lower electrode LE1, the upper electrode UE1 and the organic layer OR1 constitute the display element 20 of subpixel SP1. The lower electrode LE2, the upper electrode UE2 and the organic layer OR2 constitute the display element 20 of subpixel SP2. The lower electrode LE3, the upper electrode UE3 and the organic layer OR3 constitute the display element 20 of subpixel SP3.

The lower electrode LE1 is connected to the pixel circuit 1 (see FIG. 1) of subpixel SP1 through a contact hole CH1. The lower electrode LE2 is connected to the pixel circuit 1 of subpixel SP2 through a contact hole CH2. The lower electrode LE3 is connected to the pixel circuit 1 of subpixel SP3 through a contact hole CH3.

In the example of FIG. 2, the contact holes CH1 and CH2 entirely overlap the first partition 6x between the apertures AP1 and AP2 which are adjacent to each other in the second direction Y. The contact hole CH3 entirely overlaps the first partition 6x between two apertures AP3 which are adjacent to each other in the second direction Y. As another example, at least part of the contact hole CH1, CH2 or CH3 may not overlap the first partition 6x.

In the example of FIG. 2, the lower electrodes LE1 and LE2 comprise protrusions PR1 and PR2, respectively. The protrusion PR1 protrudes from the body of the lower electrode LE1 (the portion overlapping the aperture AP1) toward the contact hole CH1. The protrusion PR2 protrudes from the body of the lower electrode LE2 (the portion overlapping the aperture AP2) toward the contact hole CH2. The contact holes CH1 and CH2 overlap the protrusions PR1 and PR2, respectively.

FIG. 3 is a schematic cross-sectional view of the display device DSP along the III-III line of FIG. 2. A circuit layer 11 is provided on the substrate 10 described above. The circuit layer 11 includes various circuits and lines such as the pixel circuit 1, scanning line GL, signal line SL and power line PL shown in FIG. 1. The circuit layer 11 is covered with an insulating layer 12. The insulating layer 12 functions as a planarization film which planarizes the irregularities formed by the circuit layer 11. Although not shown in the section of FIG. 3, the contact holes CH1, CH2 and CH3 described above are provided in the insulating layer 12.

The lower electrodes LE1, LE2 and LE3 are provided on the insulating layer 12. The rib 5 is provided on the insulating layer 12 and the lower electrodes LE1, LE2 and LE3. The end portions of the lower electrodes LE1, LE2 and LE3 are covered with the rib 5.

The partition 6 includes a lower portion 61 provided on the rib 5 and an upper portion 62 which covers the upper surface of the lower portion 61. The upper portion 62 has a width greater than that of the lower portion 61. By this configuration, in FIG. 3, the both end portions of the upper portion 62 protrude relative to the side surfaces of the lower portion 61. This shape of the partition 6 may be called an overhang shape.

The organic layer OR1 shown in FIG. 2 includes first and second organic layers OR1a and OR1b spaced apart from each other. The upper electrode UE1 shown in FIG. 2 includes first and second upper electrodes UE1a and UE1b spaced apart from each other. As shown in FIG. 3, the first organic layer OR1a is in contact with the lower electrode LE1 through the aperture AP1 and covers part of the rib 5. The second organic layer OR1b is located on the upper portion 62. The first upper electrode UE1a faces the lower electrode LE1 and covers the first organic layer OR1a. Further, the first upper electrode UE1a is in contact with a side surface of the lower portion 61. The second upper electrode UE1b is located above the partition 6 and covers the second organic layer OR1b.

The organic layer OR2 shown in FIG. 2 includes first and second organic layers OR2a and OR2b spaced apart from each other. The upper electrode UE2 shown in FIG. 2 includes first and second upper electrodes UE2a and UE2b spaced apart from each other. As shown in FIG. 3, the first organic layer OR2a is in contact with the lower electrode LE2 through the aperture AP2 and covers part of the rib 5. The second organic layer OR2b is located on the upper portion 62. The first upper electrode UE2a faces the lower electrode LE2 and covers the first organic layer OR2a.

Further, the first upper electrode UE2a is in contact with a side surface of the lower portion 61. The second upper electrode UE2b is located above the partition 6 and covers the second organic layer OR2b.

The organic layer OR3 shown in FIG. 2 includes first and second organic layers OR3a and OR3b spaced apart from each other. The upper electrode UE3 shown in FIG. 2 includes first and second upper electrodes UE3a and UE3b spaced apart from each other. As shown in FIG. 3, the first organic layer OR3a is in contact with the lower electrode LE3 through the aperture AP3 and covers part of the rib 5. The second organic layer OR3b is located on the upper portion 62. The first upper electrode UE3a faces the lower electrode LE3 and covers the first organic layer OR3a. Further, the first upper electrode UE3a is in contact with a side surface of the lower portion 61. The second upper electrode UE3b is located above the partition 6 and covers the second organic layer OR3b.

Sealing layers 71, 72 and 73 are provided in subpixels SP1, SP2 and SP3, respectively. The sealing layer 71 continuously covers the first upper electrode UE1a, the side surface of the lower portion 61 and the second upper electrode UE1b. The sealing layer 72 continuously covers the first upper electrode UE2a, the side surface of the lower portion 61 and the second upper electrode UE2b. The sealing layer 73 continuously covers the first upper electrode UE3a, the side surface of the lower portion 61 and the second upper electrode UE3b.

In the example of FIG. 3, the second organic layer OR1b, the second upper electrode UE1b and the sealing layer 71 on the partition 6 between subpixels SP1 and SP3 are spaced apart from the second organic layer OR3b, the second upper electrode UE3b and the sealing layer 73 on this partition 6. In addition, the second organic layer OR2b, the second upper electrode UE2b and the sealing layer 72 on the partition 6 between subpixels SP2 and SP3 are spaced apart from the second organic layer OR3b, the second upper electrode UE3b and the sealing layer 73 on this partition 6.

The sealing layers 71, 72 and 73 are covered with a resinous layer 13 (first resinous layer). The resinous layer 13 is covered with a sealing layer 14. Further, the sealing layer 14 is covered with a resinous layer 15 (second resinous layer).

The insulating layer 12 and the resinous layers 13 and 15 are formed of an organic material. The rib 5 and the sealing layers 14, 71, 72 and 73 are formed of, for example, an inorganic material such as silicon nitride (SiNx).

The lower portion 61 of the partition 6 is conductive. The upper portion 62 of the partition 6 may be also conductive. The lower electrodes LE1, LE2 and LE3 may be formed of a transparent conductive material such as ITO or may comprise a multilayer structure of a metal material such as silver (Ag) and a transparent conductive material. The upper electrodes UE1, UE2 and UE3 are formed of, for example, a metal material such as an alloy of magnesium and silver (MgAg). The upper electrodes UE1, UE2 and UE3 may be formed of a transparent conductive material such as ITO.

When the potential of the lower electrodes LE1, LE2 and LE3 is relatively higher than that of the upper electrodes UE1, UE2 and UE3, the lower electrodes LE1, LE2 and LE3 are equivalent to anodes, and the upper electrodes UE1, UE2 and UE3 are equivalent to cathodes. When the potential of the upper electrodes UE1, UE2 and UE3 is relatively higher than that of the lower electrodes LE1, LE2 and LE3, the upper electrodes UE1, UE2 and UE3 are equivalent to anodes, and the lower electrodes LE1, LE2 and LE3 are equivalent to cathodes.

The organic layers OR1, OR2 and OR3 include a pair of function layers and a light emitting layer provided between these function layers. For example, the organic layers OR1, OR2 and OR3 comprise a structure in which a hole injection layer, a hole transport layer, an electron blocking layer, a light emitting layer, a hole blocking layer, an electron transport layer and an electron injection layer are stacked in order.

Subpixels SP1, SP2 and SP3 may further include a cap layer for adjusting the optical property of the light emitted from the respective light emitting layers of the organic layers OR1, OR2 and OR3. These cap layers may be provided between the upper electrode UE1 and the sealing layer 71, between the upper electrode UE2 and the sealing layer 72 and between the upper electrode UE3 and the sealing layer 73, respectively.

Common voltage is applied to the partition 6. This common voltage is applied to each of the first upper electrodes UE1a, UE2a and UE3a which are in contact with the side surfaces of the lower portions 61. Pixel voltage is applied to the lower electrodes LE1, LE2 and LE3 through the pixel circuits 1 provided in subpixels SP1, SP2 and SP3, respectively.

When a potential difference is formed between the lower electrode LE1 and the upper electrode UE1, the light emitting layer of the first organic layer OR1a emits light in a red wavelength range. When a potential difference is formed between the lower electrode LE2 and the upper electrode UE2, the light emitting layer of the first organic layer OR2a emits light in a green wavelength range. When a potential difference is formed between the lower electrode LE3 and the upper electrode UE3, the light emitting layer of the first organic layer OR3a emits light in a blue wavelength range.

As another example, the light emitting layers of the organic layers OR1, OR2 and OR3 may emit light exhibiting the same color (for example, white). In this case, the display device DSP may comprise color filters which convert the light emitted from the light emitting layers into light exhibiting colors corresponding to subpixels SP1, SP2 and SP3. The display device DSP may comprise a layer including a quantum dot which generates light exhibiting colors corresponding to subpixels SP1, SP2 and SP3 by the excitation caused by the light emitted from the light emitting layers.

The thickness of the rib 5 formed of an inorganic material is sufficiently less than that of the partition 6 and the insulating layer 12. The thickness of the rib 5 is, for example, greater than or equal to 200 nm and less than or equal to 400 nm. The thickness of each of the lower electrodes LE1, LE2 and LE3, the upper electrodes UE1, UE2 and UE3 and the organic layers OR1, OR2 and OR3 is less than that of the rib 5.

Now, this specification explains a structure which can be applied to the surrounding area SA.

FIG. 4 is a schematic plan view of the display device DSP. The display device DSP comprises, as elements provided in the surrounding area SA, a first gate drive circuit GD1, a second gate drive circuit GD2, a selector circuit ST and a terminal portion T. The first gate drive circuit GD1, the second gate drive circuit GD2 and the selector circuit ST are examples of drive circuits which supply a signal to the pixel circuits 1, and are included in the circuit layer 11 shown in FIG. 3.

The first gate drive circuit GD1 and the second gate drive circuit GD2 supply a scanning signal to the scanning lines GL shown in FIG. 1. For example, a flexible printed circuit is connected to the terminal portion T. The selector circuit ST supplies a video signal input from the flexible printed circuit to the signal lines SL shown in FIG. 1.

The substrate 10 comprises a first end portion E1, a second end portion E2, a third end portion E3 and a fourth end portion E4. The first end portion E1 and the second end portion E2 extend parallel to the second direction Y. The third end portion E3 and the fourth end portion E4 extend parallel to the first direction X.

In the example of FIG. 4, the first gate drive circuit GD1 is provided between the display area DA and the first end portion E1. The second gate drive circuit GD2 is provided between the display area DA and the second end portion E2. The selector circuit ST and the terminal portion T are provided between the display area DA and the third end portion E3.

Further, the display device DSP comprises a conductive layer CL and a dam portion DP provided in the surrounding area SA. In the example of FIG. 4, the conductive layer CL surrounds the display area DA. In addition, the dam portion DP surrounds the conductive layer CL. For example, the dam portion DP functions to dam up the resinous layer 13 shown in FIG. 3.

The conductive layer CL is connected to the partition 6 provided in the display area DA. The conductive layer CL overlaps the first gate drive circuit GD1, the second gate drive circuit GD2 and the selector circuit ST as seen in plan view.

It should be noted that the conductive layer CL may not necessarily have a shape surrounding the display area DA. For example, the conductive layer CL may not be provided between the display area DA and the third end portion E3 or between the display area DA and the fourth end portion E4.

Figure 6:
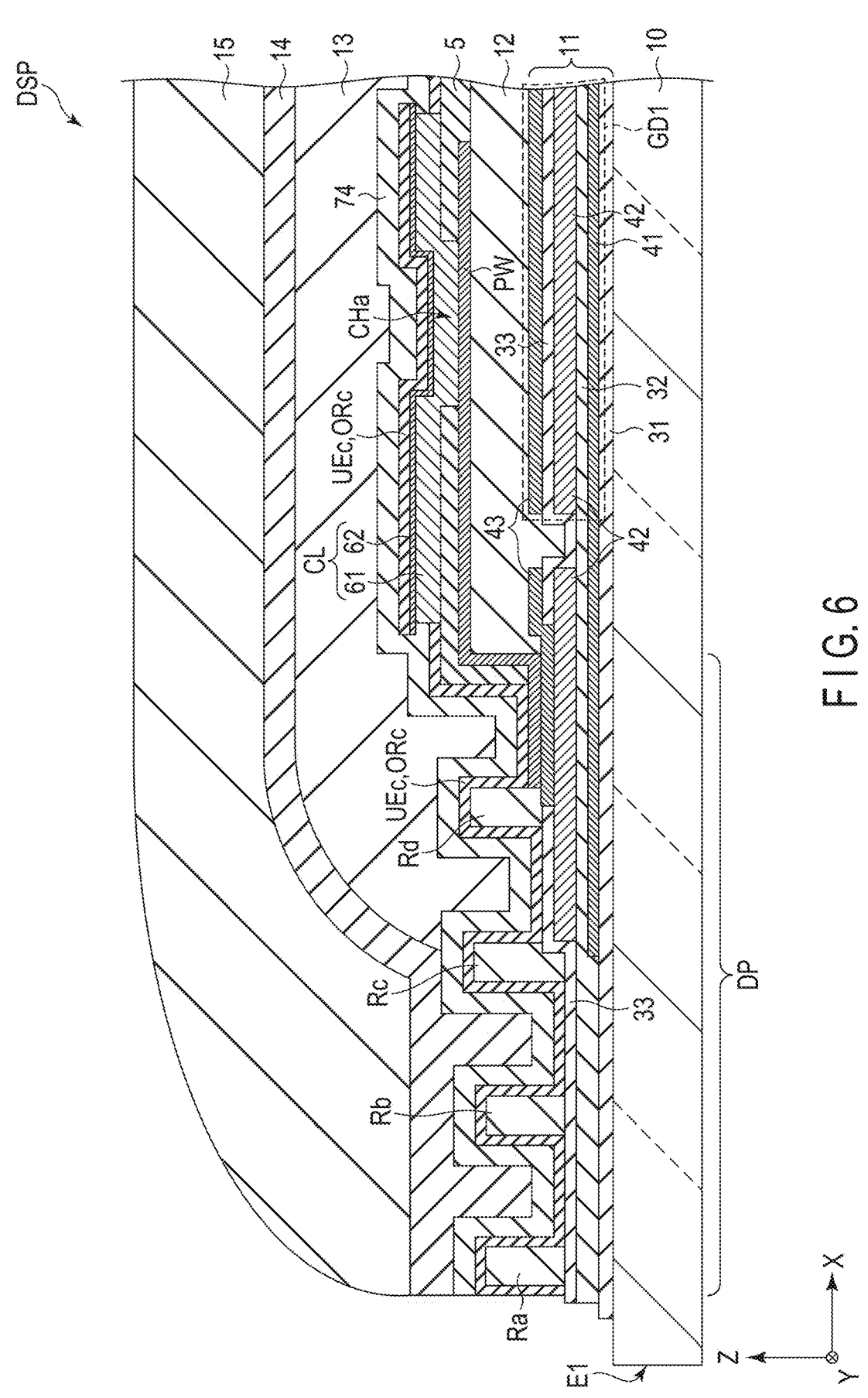
FIG. 6 is a schematic cross-sectional view of the display device along the VI-VI line of FIG. 5.

FIG. 5 is an enlarged view of the area surrounded by the chained frame V in FIG. 4. FIG. 6 is a schematic cross-sectional view of the display device DSP along the VI-VI line of FIG. 5. In FIG. 5, the dotted area is equivalent to the conductive layer CL and the partition 6 (the first partitions 6x and the second partitions 6y). The conductive layer CL and the partition 6 are integrally formed of the same material by the same manufacturing process.

In the example of FIG. 6, the circuit layer 11 comprises insulating layers 31, 32 and 33 and metal layers 41, 42 and 43. The insulating layer 31 covers the substrate 10. The metal layer 41 is provided on the insulating layer 31 and is covered with the insulating layer 32. The metal layer 42 is provided on the insulating layer 32 and is covered with the insulating layer 33. The metal layer 43 is provided on the insulating layer 33 and is covered with the insulating layer 12.

The first gate drive circuit GD1 consists of the metal layers 41, 42 and 43 and a semiconductor layer. Similarly, the second gate drive circuit GD2 and the selector circuit ST shown in FIG. 4 consist of the metal layers 41, 42 and 43 and a semiconductor layer.

The rib 5 is also provided in the surrounding area SA. The conductive layer CL is provided on the rib 5. The conductive layer CL includes a lower portion 61 and an upper portion 62 in a manner similar to that of the partition 6 shown in FIG. 3. In the conductive layer CL, the both end portions of the upper portion 62 protrude relative to the side surfaces of the lower portion 61.

In the section of FIG. 6, a feed line PW is provided between the insulating layer 12 and the rib 5. The feed line PW is connected to, for example, part of the metal layer 43. Common voltage is applied to the feed line PW. For example, the feed line PW is formed of the same material by the same manufacturing process as the lower electrodes LE1, LE2 and LE3. The rib 5 comprises a contact hole CHa. The lower portion 61 of the conductive layer CL is connected to the feed line PW through the contact hole CHa.

In the example of FIG. 5, a plurality of contact holes CHa are provided in the surrounding area SA. These contact holes CHa extend in the first direction X longwise and are arranged in the second direction Y. The shape or layout of the contact holes CHa is not limited to this example and may be modified in various ways.

The conductive layer CL comprises a plurality of apertures APa arranged at regular intervals in the first direction X and the second direction Y. In the example of FIG. 5, some of the apertures APa are located between the contact holes CHa which are adjacent to each other in the second direction Y. For example, each aperture APa is smaller than each contact hole CHa as seen in plan view.

To form the conductive layer CL and the partition 6, first, the base layers for the lower portion 61 and the upper portion 62 are formed in the entire part of the display area DA and the surrounding area SA, and these layers are patterned into the shapes of the conductive layer CL and the partition 6 by etching. The display area DA comprises many apertures corresponding to subpixels SP1, SP2 and SP3, respectively (the areas surrounded by the first partitions 6x and the second partitions 6y). When the density of the apertures differs between the display area DA and the surrounding area SA, there is a possibility that etching cannot be evenly performed. However, by providing a plurality of apertures APa in the conductive layer CL, etching can be evenly performed in the display area DA and the surrounding area SA.

As shown in FIG. 6, an organic layer ORc (third organic layer), an upper electrode UEc (third upper electrode) and a sealing layer 74 (first sealing layer) are provided in the surrounding area SA. In the example of FIG. 6, the organic layer ORc and the upper electrode UEc are shown as one layer. However, in fact, the organic layer ORc is provided under the upper electrode UEc. The organic layer ORc and the upper electrode UEc cover the conductive layer CL. The sealing layer 74 covers the organic layer ORc and the upper electrode UEc.

The organic layer ORc is formed of the same material by the same process as one of the organic layers OR1, OR2 and OR3, for example, as the organic layer OR3. The upper electrode UEc is formed of the same material by the same process as one of the upper electrodes UE1, UE2 and UE3, for example, as the upper electrode UE3. The sealing layer 74 is formed of the same material by the same process as one of the sealing layers 71, 72 and 73, for example, as the sealing layer 73.

As the conductive layer CL has an overhang shape in a manner similar to that of the partition 6, the organic layer ORc and the upper electrode UEc are divided near the end portion of the conductive layer CL. In other words, part of the organic layer ORc and the upper electrode UEc is located on the upper portion 62 of the conductive layer CL. The end portion of the other portion is in contact with the side surface of the lower portion 61 of the conductive layer CL.

As shown in FIG. 5, the dam portion DP comprises ridges Ra, Rb, Rc and Rd. These ridges Ra, Rb, Rc and Rd extend parallel to the second direction Y between the display area DA and the first end portion E1. For example, the ridges Ra, Rb, Rc and Rd have a frame shape surrounding the display area DA and the conductive layer CL. In other words, the conductive layer CL is located between the ridges Ra, Rb, Rc and Rd and the display area DA. It should be noted that the number of ridges provided in the dam portion DP is not limited to four and may be three or less or five or more.

In the example of FIG. 6, the rib 5 is not provided in the dam portion DP, and each of the ridges Ra, Rb, Rc and Rd is provided on the insulating layer 33. As another example, the rib 5 may be provided in the dam portion DP, and at least one of the ridges Ra, Rb, Rc and Rd may be provided on the rib 5.

In the example of FIG. 6, the ridges Ra, Rb, Rc and Rd have a thickness greater than that of the sealing layer 74 and the conductive layer CL. For example, the ridges Ra, Rb, Rc and Rd are formed of the same material by the same process as the insulating layer 12. The organic layer ORc, the upper electrode UEc and the sealing layer 74 cover the ridges Ra, Rb, Rc and Rd.

The resinous layer 13 is formed by, for example, an ink-jet method. The irregularities of the sealing layer 74 formed by the ridges Ra, Rb, Rc and Rd prevent the expansion of the resinous layer 13 before curing. In FIG. 6, the end portion of the resinous layer 13 is located near the ridge Rc. However, the configuration is not limited to this example. The sealing layer 14 (second sealing layer) is in contact with the sealing layer 74 outside the end portion of the resinous layer 13 (between the end portion of the resinous layer 13 and the first end portion E1). The resinous layer 15 covers the sealing layer 14 as a whole.

In FIG. 5 and FIG. 6, this specification focuses attention on the structure between the display area DA and the first end portion E1. However, a similar structure can be applied to the structure between the display area DA and the second end portion E2, the structure between the display area DA and the third end portion E3 and the structure between the display area DA and the fourth end portion E4.

In the display device DSP of the present embodiment described above, the partition 6 provided in the display area DA is connected to the conductive layer CL provided in the surrounding area SA. Further, the partition 6 is connected to the upper electrodes UE1, UE2 and UE3 of subpixels SP1, SP2 and SP3, and the conductive layer CL is connected to the feed line PW. In this structure, the common voltage of the feed line PW can be applied to the upper electrodes UE1, UE2 and UE3 via the conductive layer CL and the partition 6.

The partition 6 and the conductive layer CL comprise the lower portion 61, and the upper portion 62 comprising an end portion protruding from a side surface of the lower portion 61. In this structure, the organic layers OR1, OR2 and OR3 are divided by the partition 6 in the display area DA, thereby preventing the crosstalk of adjacent subpixels SP. In the surrounding area SA, the organic layer ORc is divided by the conductive layer CL, thereby preventing the incursion of moisture through the organic layer ORc.

When the conductive layer CL has a shape surrounding the display area DA as shown in FIG. 4, the feed line PW can be connected to the conductive layer CL in each portion around the display area DA, and further, the conductive layer CL can be connected to the partition 6. In this way, common voltage can be satisfactorily applied to the entire display area DA. In addition, the organic layer ORc can be divided by the conductive layer CL over the entire part around the display area DA.

All of the display devices that can be implemented by a person of ordinary skill in the art through arbitrary design changes to the display device described above as the embodiment of the present invention come within the scope of the present invention as long as they are in keeping with the spirit of the present invention.

Various modification examples which may be conceived by a person of ordinary skill in the art in the scope of the idea of the present invention will also fall within the scope of the invention. For example, even if a person of ordinary skill in the art arbitrarily modifies the above embodiments by adding or deleting a structural element or changing the design of a structural element, or adding or omitting a step or changing the condition of a step, all of the modifications fall within the scope of the present invention as long as they are in keeping with the spirit of the invention.

Further, other effects which may be obtained from each embodiment and are self-explanatory from the descriptions of the specification or can be arbitrarily conceived by a person of ordinary skill in the art are considered as the effects of the present invention as a matter of course.

What is claimed is:

1. A display device comprising:
a substrate;
an insulating layer provided above the substrate;
a lower electrode provided above the insulating layer in a display area including a pixel;
a rib comprising an aperture overlapping the lower electrode;
a conductive partition provided above the rib in the display area;
an upper electrode facing the lower electrode and connected to the partition;
an organic layer at least partially located between the lower electrode and the upper electrode and emitting light based on a potential difference between the lower electrode and the upper electrode;
a feed line provided in a surrounding area around the display area; and
a conductive layer provided above the rib in the surrounding area and connected to the feed line and the partition,
wherein the conductive layer and the partition are integrally formed of the same material.

2. The display device of claim 1, wherein
the feed line is located between the insulating layer and the rib,
the rib comprises a plurality of contact holes provided in the surrounding area, and
the conductive layer is connected to the feed line through the contact holes.

3. The display device of claim 2, wherein
the contact holes extend in a first direction longwise and are arranged in a second direction intersecting with the first direction.

4. The display device of claim 2, wherein
the conductive layer comprises a plurality of apertures.

5. The display device of claim 4, wherein
the apertures of the conductive layer are smaller than the contact holes.

6. The display device of claim 1, further comprising:
a pixel circuit provided in the display area and applying voltage to the lower electrode; and
a drive circuit provided in the surrounding area and supplying a signal to the pixel circuit, wherein
at least part of the conductive layer overlaps the drive circuit as seen in plan view.

7. The display device of claim 1, wherein
the conductive layer surrounds the display area as seen in plan view.

8. The display device of claim 1, wherein
the organic layer includes a first organic layer which is in contact with the lower electrode through the aperture, and a second organic layer located on the partition and spaced apart from the first organic layer.

9. The display device of claim 8, wherein
the organic layer further includes a third organic layer which covers the conductive layer.

10. The display device of claim 9, wherein
the third organic layer is divided by an end portion of the conductive layer.

11. The display device of claim 1, wherein
the partition and the conductive layer include a lower portion provided on the rib, and an upper portion provided on the lower portion and comprising an end portion protruding from a side surface of the lower portion.

12. The display device of claim 11, wherein
the upper electrode is in contact with the side surface of the lower portion.

13. The display device of claim 12, wherein
the lower portion is conductive.

14. The display device of claim 1, further comprising a dam portion provided in the surrounding area and surrounding the conductive layer.

15. The display device of claim 14, wherein
the dam portion comprises at least one ridge which surrounds the conductive layer.

16. The display device of claim 14, further comprising a first sealing layer provided above the conductive layer in the surrounding area, wherein
the first sealing layer covers the dam portion.

17. The display device of claim 16, further comprising a first resinous layer which covers the first sealing layer, wherein
an end portion of the first resinous layer is located in the dam portion.

18. The display device of claim 17, further comprising a second sealing layer which covers the first resinous layer.

19. The display device of claim 18, wherein
the second sealing layer is in contact with the first sealing layer between an end portion of the first resinous layer and an end portion of the substrate.

20. The display device of claim 19, further comprising a second resinous layer which covers the second sealing layer.

* * * * *